(12) United States Patent
Shirai et al.

(10) Patent No.: US 6,622,391 B1
(45) Date of Patent: Sep. 23, 2003

(54) INCREMENTAL ROTARY ENCODER, AND A SURVEYING INSTRUMENT INCORPORATING A MAGNETIC INCREMENTAL ROTARY ENCODER

(75) Inventors: Masami Shirai, Saitama (JP); Masato Noguchi, Saitama (JP); Katsuhiko Kenjo, Tokyo (JP)

(73) Assignees: Pentax Corporation, Tokyo (JP); Pentax Precision Co., Ltd., Tokyo (JP)

( * ) Notice: Subject to any disclaimer, the term of this patent is extended or adjusted under 35 U.S.C. 154(b) by 0 days.

(21) Appl. No.: 09/559,741

(22) Filed: Apr. 27, 2000

(30) Foreign Application Priority Data

Oct. 22, 1999 (JP) .......................... 11-301115
Apr. 28, 1999 (JP) .......................... 11-123075

(51) Int. Cl.$^7$ .............................. G01B 7/30; G01C 1/02; H03M 1/22
(52) U.S. Cl. .......................... 33/292; 33/1 PT; 33/290; 341/11; 341/15
(58) Field of Search .................. 33/291, 292, 290, 33/1 PT, 1 N, 606, 607, 608, 534; 341/11, 15, 111, 116, 117; 324/76.11, 76.52, 76.53, 76.72, 200, 233, 242, 243, 245, 252, 254

(56) References Cited

U.S. PATENT DOCUMENTS

| | | | | |
|---|---|---|---|---|
| 4,319,188 A | * | 3/1982 | Ito | 324/173 |
| 4,335,306 A | * | 6/1982 | Gort et al. | 250/231.14 |
| 4,752,126 A | * | 6/1988 | Fujii | 356/140 |
| 4,866,382 A | * | 9/1989 | Carmen et al. | 324/207.21 |
| 4,870,272 A | * | 9/1989 | Wilson, III | 250/231.13 |
| 4,972,599 A | * | 11/1990 | Ernst | 33/706 |
| 5,012,238 A | * | 4/1991 | Hayashi et al. | 341/15 |
| 5,036,319 A | * | 7/1991 | Shiraki | 341/15 |
| 5,101,102 A | * | 3/1992 | Nishimura et al. | 250/231.16 |
| 5,150,115 A | * | 9/1992 | deJong et al. | 340/870.31 |
| 5,216,480 A | * | 6/1993 | Kaneko et al. | 356/139.06 |
| 5,272,922 A | * | 12/1993 | Watson | 73/504.16 |
| 5,446,966 A | * | 9/1995 | Ishizaki | 33/1 PT |
| 5,596,189 A | * | 1/1997 | Orton | 250/231.16 |
| 5,598,201 A | * | 1/1997 | Stodder et al. | 347/104 |
| 5,898,301 A | * | 4/1999 | La Croix et al. | 324/207.22 |
| 6,093,928 A | * | 7/2000 | Ohtomo et al. | 250/231.13 |
| 6,170,162 B1 | * | 1/2001 | Jacobsen et al. | 33/1 PT |
| 6,175,181 B1 | * | 1/2001 | Shirasaki | 310/323.04 |
| 6,188,341 B1 | * | 2/2001 | Taniguchi et al. | 341/116 |
| 6,215,119 B1 | * | 4/2001 | Markham et al. | 250/231.14 |
| 6,259,249 B1 | * | 7/2001 | Miyata | 324/207.17 |
| 6,304,079 B1 | * | 10/2001 | Kenjo et al. | 324/207.21 |
| 6,356,076 B1 | * | 3/2002 | Luetzow | 324/207.25 |
| 6,384,405 B1 | * | 5/2002 | Kenjo et al. | 250/231.14 |
| 6,433,536 B1 | * | 8/2002 | Yundt et al. | 324/207.22 |
| 6,482,806 B1 | * | 11/2002 | Koyama et al. | 514/54 |
| 2002/0005716 A1 | * | 1/2002 | Shirai | 324/207.21 |
| 2002/0105445 A1 | * | 8/2002 | Shirai et al. | 341/7 |
| 2002/0153479 A1 | * | 10/2002 | Kenjo et al. | 250/231.14 |

FOREIGN PATENT DOCUMENTS

JP          63-6418          1/1988

* cited by examiner

Primary Examiner—Diego Gutierrez
Assistant Examiner—R. Alexander Smith
(74) Attorney, Agent, or Firm—Greenblum & Bernstein, P.L.C.

(57) ABSTRACT

An incremental rotary encoder includes a rotary portion, a first sensor and a second sensor, the first and second sensors being arranged so as to be opposite from each other with respect to the axis of the rotary portion. The second sensor is offset from the first sensor so that the phase of output voltage of the second sensor advances or delays with respect to the phase of output voltage of the first sensor by $\pi/X$, wherein "X" represents a real number of one or more than one.

27 Claims, 9 Drawing Sheets

Phase Difference Adjustment

$P_1 \lambda + \lambda/2n$ $(2\pi P_1 + \pi/n)$ $(2\pi P_1 + \pi/X)$

Prior Art

US 6,622,391 B1

INCREMENTAL ROTARY ENCODER, AND A SURVEYING INSTRUMENT INCORPORATING A MAGNETIC INCREMENTAL ROTARY ENCODER

BACKGROUND OF THE INVENTION

1. Field of the Invention

The present invention relates to an incremental rotary encoder which is suitable for surveying instrument such as total stations, theodlites or the like. The present invention also relates to a surveying instrument which incorporates a magnetic incremental rotary encoder.

2. Description of the Related Art

Figure 10:
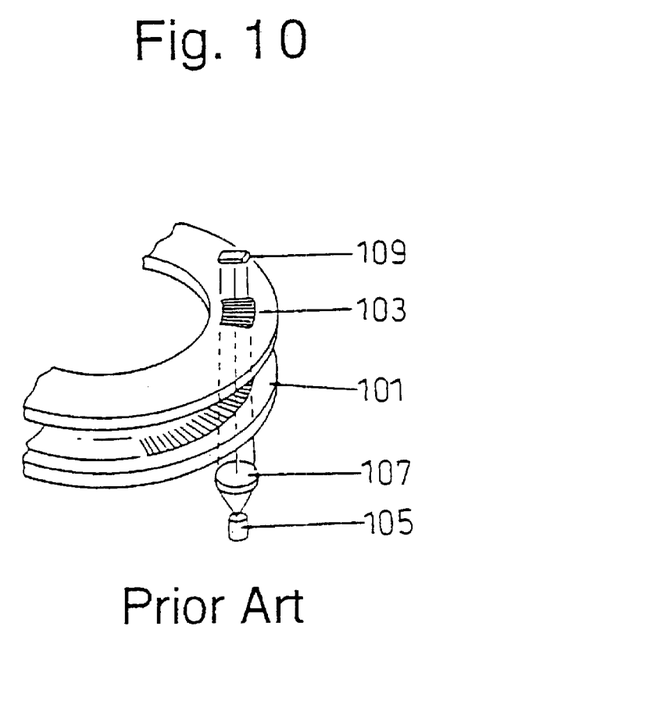
FIG. 10 is a schematic perspective view of part of a conventional optical incremental rotary encoder.

Some conventional surveying instruments such as total stations, theodlites or the like are provided with an incremental rotary encoder as an angle measuring device. For instance, an optical incremental rotary encoder is used to measure horizontal or vertical angles. FIG. 10 shows a conventional optical incremental rotary encoder. This optical incremental rotary encoder is provided with a main scale 101, a sub-scale 103, an LED (light source) 105, a collimating lens 107 and a photosenor (detector) 109. The main scale 101 and the sub-scale 103 are positioned between the collimating lens 107 and the photosenor 109. In this optical incremental rotary encoder, each of the two scales 101 and 103 is made of glass, which makes the weight of the encoder heavy. Furthermore, in this optical incremental rotary encoder, since the main scale 101 and the sub-scale 103 are arranged separately from each other in the axial direction (the vertical direction as viewed in FIG. 10) while the light source 105 and the collimating lens 107, and the detector 109 need to be positioned on the opposite sides of the main scale and the sub-scale 101 and 103, the space in which the optical incremental rotary encoder is disposed needs to be wide in the axial direction thereof.

Similar to the optical incremental rotary encoder, a magnetic incremental rotary encoder is also known as an angle measuring device. A magnetic incremental rotary encoder is generally provided, on an outer peripheral surface of a magnetic drum (graduator disc) thereof, with a multi-pole magnetized layer having a plurality of magnetized divisions equally divided by the number of divisions N ("N" being a positive integer). The magnetic incremental rotary encoder is further provided with a magnetic sensor positioned to face the multi-pole magnetized layer. This magnetic sensor is provided thereon with, e.g., four magnetoresistor elements which are disposed at equally spaced intervals whose pitch is smaller than that of the plurality of magnetized divisions of the multi-pole magnetized layer to detect the variation in the resistance values of the four magnetoresistor elements which vary in accordance with the rotation of the magnetic drum to thereby determine the rotational angle of the magnetic drum with high precision corresponding to the pitch of the plurality of magnetized divisions of the multi-pole magnetized layer. The angle of the pitch is determined according to an interpolative calculation.

The error of the surveying instrument due to eccentricity of the graduator disc (protractor disc) is restricted by the Japanese Industrial Standard. Therefore, in a surveying instrument of a high degree of precision, it is necessary to have two magnetic sensors which are positioned on the opposite sides (offset from each other by 180 degrees) of the graduator disc with respect to the axis thereof so as to compensate for error due to the eccentricity of the graduator disc by taking the average of the detected output voltages of the two magnetic sensors.

Surveying instruments are generally required to have a high degree of precision in their functions. However, in a magnetic incremental rotary encoder, the number of the magnetized divisions (the number of divisions N) of the multi-pole magnetized layer cannot be made as many as that of an optical incremental rotary encoder. Accordingly, influence of harmonic distortion within one pitch of the magnetized divisions is large due to dimensional error and/or deviation of the magnetic resistance curve from the ideal value thereof. Moreover, the magnetic incremental rotary encoder has to be made with extreme precision, so that it is necessary to use a large number of magnetic sensors or magnetoresistor elements to compensate for the harmonic distortion which occurs.

SUMMARY OF THE INVENTION

An object of the present invention is to provide an incremental rotary encoder in which error due to eccentricity of the graduator disc thereof and also arbitrary-order harmonic distortion can be simultaneously compensated.

Another object of the present invention is to provide a magnetic incremental rotary encoder which can be incorporated in, and is suitable for, a surveying instrument. Another object of the present invention is to provide a surveying instrument incorporating a magnetic incremental rotary encoder.

Other objects will become apparent to one skilled in the art from a reading of the following disclosure and the appended claims.

To achieve the object mentioned above, according to an aspect of the present invention, an incremental rotary encoder is provided which includes a rotary portion, a first sensor and a second sensor, the first and second sensors being arranged so as to be opposite from each other with respect to the axis of the rotary portion. The second sensor is offset from the first sensor so that the phase of output voltage of the second sensor advances or delays with respect to the phase of output voltage of the first sensor by $\pi/X$, wherein "X" represents a real number of one or more than one.

In an embodiment, the second sensor is offset from the first sensor so that the phase of output voltage of the second sensor advances or delays with respect to the phase of output voltage of the first sensor by $\lambda/2n$ in the case where an n-order harmonic distortion is compensated for, wherein the pitch of the harmonic distortion is $\lambda/n$.

Preferably, third and fourth sensors are provided, independently of the first and second sensors, which are arranged so as to be opposite from each other with respect to the axis of the rotary portion. In this case, the fourth sensor is offset from the third sensor so that the phase of output voltage of the fourth sensor advances or delays with respect to the phase of output voltage of the third sensor by $\lambda/2m$ in the case where a m-order harmonic distortion is compensated for, wherein the pitch of the harmonic distortion is $\lambda/m$.

Preferably, the second sensor is provided in the incremental rotary encoder so that a phase difference of the second sensor with respect to the first sensor is adjustable.

In an embodiment, rotary portion includes a magnetic drum which is rotatably supported by a stationary portion of an optical instrument in which the incremental rotary encoder is incorporated, wherein an outer peripheral surface of the magnetic drum includes a multi-pole magnetized layer having a plurality of magnetized divisions equally divided. Each of the first and second sensors includes a magnetic sensor which is fixed to the stationary portion to face the multi-pole magnetized layer. Each of the first and second sensors includes a plurality of magnetoresistor elements which are located at λ/4 intervals on the each sensor, "λ" representing the pitch of the plurality of magnetized divisions. Error due to eccentricity of the magnetic drum and the n-order harmonic distortion are compensated for at the same time by taking an average of detected outputs of the first and second magnetic sensors.

In an embodiment, the rotary portion includes a magnetic drum which is rotatably supported by a stationary portion of an optical instrument in which the incremental rotary encoder is incorporated, an outer peripheral surface of the magnetic drum including a multi-pole magnetized layer having a plurality of magnetized divisions equally divided. Each of the first, second, third and fourth sensors includes a magnetic sensor which is fixed to the stationary portion to face the multi-pole magnetized layer, wherein each of the first, second, third and fourth sensors includes a plurality of magnetoresistor elements which are located at λ/4 or λ (3/4) intervals on the each sensor, "λ" representing the pitch of the plurality of magnetized divisions. An error due to the eccentricity of the magnetic drum and the n-order harmonic distortion are compensated for at the same time by taking an average of detected outputs of the first and second magnetic sensors. The error due to the eccentricity of the magnetic drum and the m-order harmonic distortion are compensated for at the same time by taking an average of detected outputs of the third and fourth magnetic sensors. The error due to the eccentricity of the magnetic drum, the n-order harmonic distortion and the m-order harmonic distortion are compensated for at the same time by taking an average of detected outputs of the first, second, third and fourth magnetic sensors.

Preferably, the second magnetic sensor is provided in the incremental rotary encoder so that a phase difference of the second magnetic sensor with respect to the first magnetic sensor is adjustable.

Preferably, an adjusting mechanism is further provided which allows the second magnetic sensor to move the second magnetic sensor on a circle about an axis of the magnetic drum along the multi-pole magnetized layer to adjust a phase difference of the second sensor with respect to the first sensor.

Preferably, the phase difference is adjusted to make the sum of a plurality of harmonic distortions minimal in the case of compensating for the plurality of harmonic distortions.

According to another aspect of the present invention, a surveying instrument is provided, which includes a leveling board, a pedestal coupled to the leveling board to be rotatable about a vertical axis relative to the leveling board, a collimating telescope coupled to the pedestal to be rotatable about a horizontal axis relative to the pedestal, a horizontal-angle measuring device for measuring an angle of rotation of the pedestal relative to the leveling board, and a vertical-angle measuring device for measuring an angle of rotation of the collimating telescope relative to the pedestal. At least one of the horizontal-angle measuring device and the vertical-angle measuring device includes an incremental rotary encoder. The incremental rotary encoder includes a rotary portion, a first sensor and a second sensor. The first and second sensors being arranged so as to be opposite from each other with respect to the axis of the rotary portion. The second sensor is offset from the first sensor so that the phase of output voltage of the second sensor advances or delays with respect to the phase of output voltage of the first sensor by π/X, wherein "X" represents a real number of one or more than one.

According to this structure, a conventional surveying instrument can be made light-weight while consuming less space in the surveying instrument, so that the problem of the conventional surveying instrument being heavy to carry and bulky can be improved.

In the case where the magnetic drum is provided on an outer peripheral surface thereof with a multi-pole magnetized layer having a plurality of magnetized divisions equally divided by the number of divisions, it is preferable that the pitch of the plurality of magnetized divisions be represented by the following equation:

$$60 < L < 250 (\mu m)$$

wherein "L" represents the pitch of the plurality of magnetized divisions.

If the pitch L becomes shorter than 60 μm, the positions of the magnetic sensors relative to the magnetic drum have to be minutely adjusted with extreme precision and at the same time the magnetoresistor elements mounted on each magnetic sensor have to be arranged thereon with extreme precision, which makes it difficult to produce the magnetic incremental rotary encoder. On the other hand, if the pitch L becomes greater than 250 μm, in the adjusting operation in which the positions of the magnetic sensors are adjusted while monitoring the Lissajous's figures (or Bowditch curves) of the output values of the magnetic sensors on the screen of an oscilloscope, the occurrence of a slight variation in the Lissajous's figures causes the error to vary largely, so that the difference among the Lissajous's figures cannot be visually determined. This makes it impossible to perform the adjusting operation with high precision. Namely, even if the magnetic incremental rotary encoder is passed by a visual inspection in which the Lissajous's figures are visually inspected, it is often the case that the error has not been yet sufficiently compensated for.

Preferably, the second sensor is offset from the first sensor so that the phase of output voltage of the second sensor advances or delays with respect to the phase of output voltage of the first sensor by λ/2n in the case where an n-order harmonic distortion is compensated for, wherein the pitch of the harmonic distortion is λ/n.

Preferably, third and fourth sensors are further provided, independently of the first and second sensors, which are arranged so as to be opposite from each other with respect to the axis of the rotary portion. The fourth sensor is offset from the third sensor so that the phase of output voltage of the fourth sensor advances or delays with respect to the phase of output voltage of the third sensor by λ/2m in the case where (m-order harmonic distortion is compensated for, wherein the pitch of the harmonic distortion is λ/m.

Preferably, the second sensor is provided in the incremental rotary encoder so that a phase difference of the second sensor with respect to the first sensor is adjustable.

Preferably, the rotary portion includes a magnetic drum which is rotatably supported by a stationary portion of an optical instrument in which the incremental rotary encoder is incorporated, wherein an outer peripheral surface of the magnetic drum includes a multi-pole magnetized layer having a plurality of magnetized divisions equally divided. Each of the first and second sensors includes a magnetic sensor which is fixed to the stationary portion to face the multi-pole magnetized layer. Each of the first and second sensors includes a plurality of magnetoresistor elements which are located at λ/4 intervals on the each sensor, "λ" representing the pitch of the plurality of magnetized divisions. Error due to eccentricity of the magnetic drum and the n-order harmonic distortion are compensated for at the same time by taking an average of detected outputs of the first and second magnetic sensors.

Preferably, the rotary portion includes a magnetic drum which is rotatably supported by a stationary portion of an optical instrument in which the incremental rotary encoder is incorporated, an outer peripheral surface of the magnetic drum including a multi-pole magnetized layer having a plurality of magnetized divisions equally divided. Each of the first, second, third and fourth sensors includes a magnetic sensor which is fixed to the stationary portion to face the multi-pole magnetized layer. Each of the first, second, third and fourth sensors includes a plurality of magnetoresistor elements which are located at $\lambda/4$ or $\lambda(3/4)$ intervals on the each sensor, "$\lambda$" representing the pitch of the plurality of magnetized divisions. An error due to the eccentricity of the magnetic drum and the n-order harmonic distortion are compensated for at the same time by taking an average of detected outputs of the first and second magnetic sensors. The error due to the eccentricity of the magnetic drum and the m-order harmonic distortion are compensated for at the same time by taking an average of detected outputs of the third and fourth magnetic sensors. Error due to the eccentricity of the magnetic drum, the n-order harmonic distortion and the m-order harmonic distortion are compensated for at the same time by taking an average of detected outputs of the first, second, third and fourth magnetic sensors.

Preferably, the second magnetic sensor is provided in the incremental rotary encoder so that a phase difference of the second magnetic sensor with respect to the first magnetic sensor is adjustable.

Preferably, an adjusting mechanism is provided which allows the second magnetic sensor to move the second magnetic sensor on a circle about an axis of the magnetic drum along the multi-pole magnetized layer to adjust a phase difference of the second sensor with respect to the first sensor.

Preferably, the phase difference is adjusted to make the sum of a plurality of harmonic distortions minimal in the case of compensating for the plurality of harmonic distortions.

Preferably, the pitch of the plurality of magnetized divisions is represented by the following equation:

$$60 < L < 250 (\mu m)$$

wherein "L" represents the pitch of the plurality of magnetized divisions.

Preferably, the magnetic drum is supported to be rotatable about one of the vertical and horizontal axes, each of the magnetic sensors being fixed to one of the leveling board and the pedestal to face the multi-pole magnetized layer.

Preferably, the surveying instrument further includes a vertical shaft fixed to the leveling board, at least one support formed on the pedestal, and a horizontal shaft supported by the at least one support. The pedestal is supported by and rotatable about the vertical shaft. The magnetic drum rotates together with the at least one support. The collimating telescope is supported by the at least one support via the horizontal shaft.

Preferably, the surveying instrument further includes at least one support formed on the pedestal, and a horizontal shaft fixed to the at least one support. The magnetic drum is supported by the horizontal shaft to be rotatable about the horizontal shaft. The collimating telescope is supported by and rotatable about the horizontal shaft wherein the magnetic drum is rotatable together with the collimating telescope. Each of the magnetic sensors is fixed to the at least one support to face the multi-pole magnetized layer.

The present disclosure relates to subject matter contained in Japanese Patent Applications Nos.11-123075 (filed on Apr. 28, 1999) and 11-301115 (filed on Oct. 22, 1999) which are expressly incorporated herein by reference in their entireties.

BRIEF DESCRIPTION OF THE DRAWINGS

The present invention will be discussed below in detail with reference to the accompanying drawings, in which.

DESCRIPTION OF THE PREFERRED EMBODIMENTS

Figure 1:
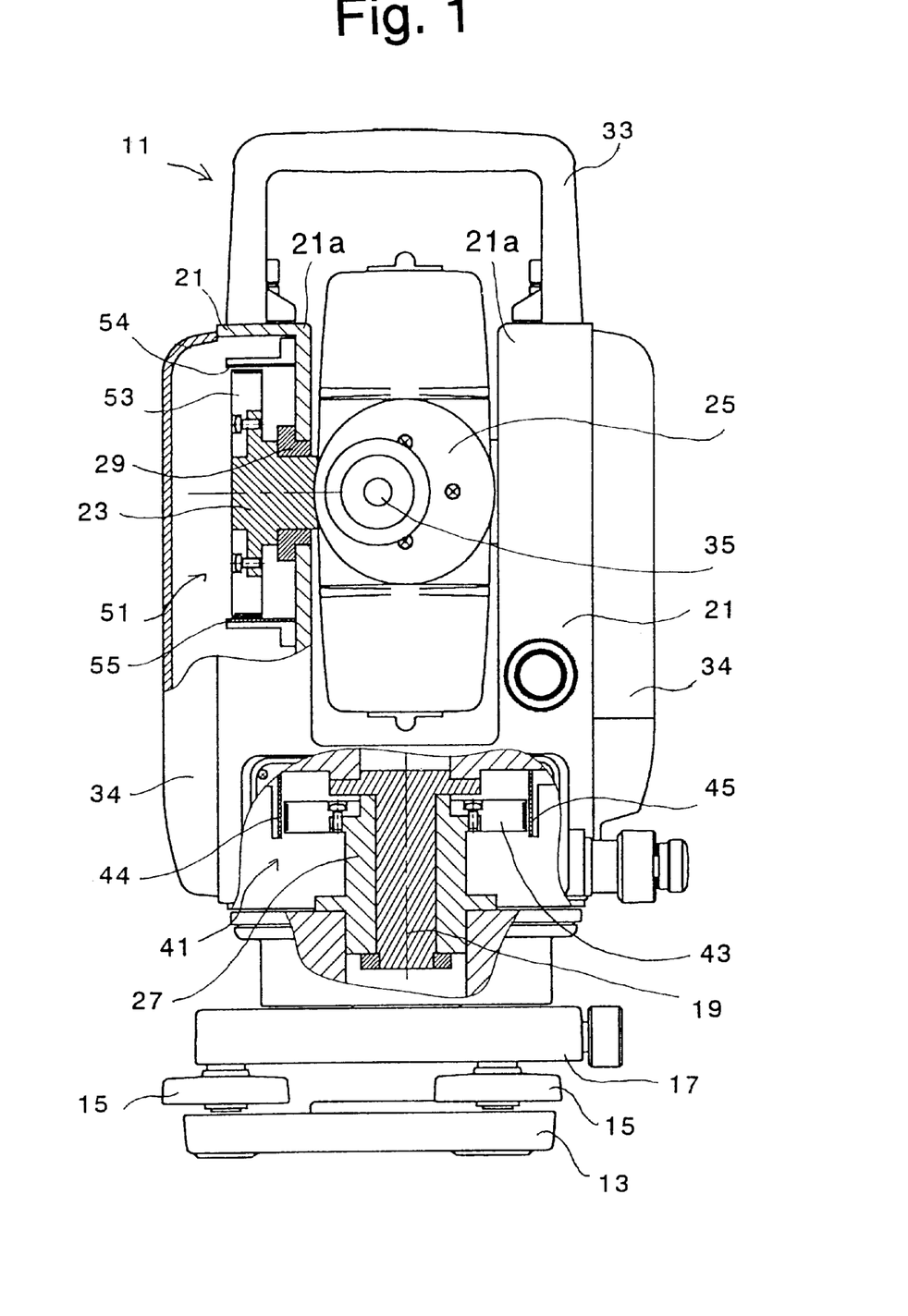
FIG. 1 is a rear elevational view of the first embodiment of a total station which incorporates two magnetic incremental rotary encoders to which the present invention is applied, showing fundamental elements of each magnetic incremental rotary encoder in cross section.
Figure 2:
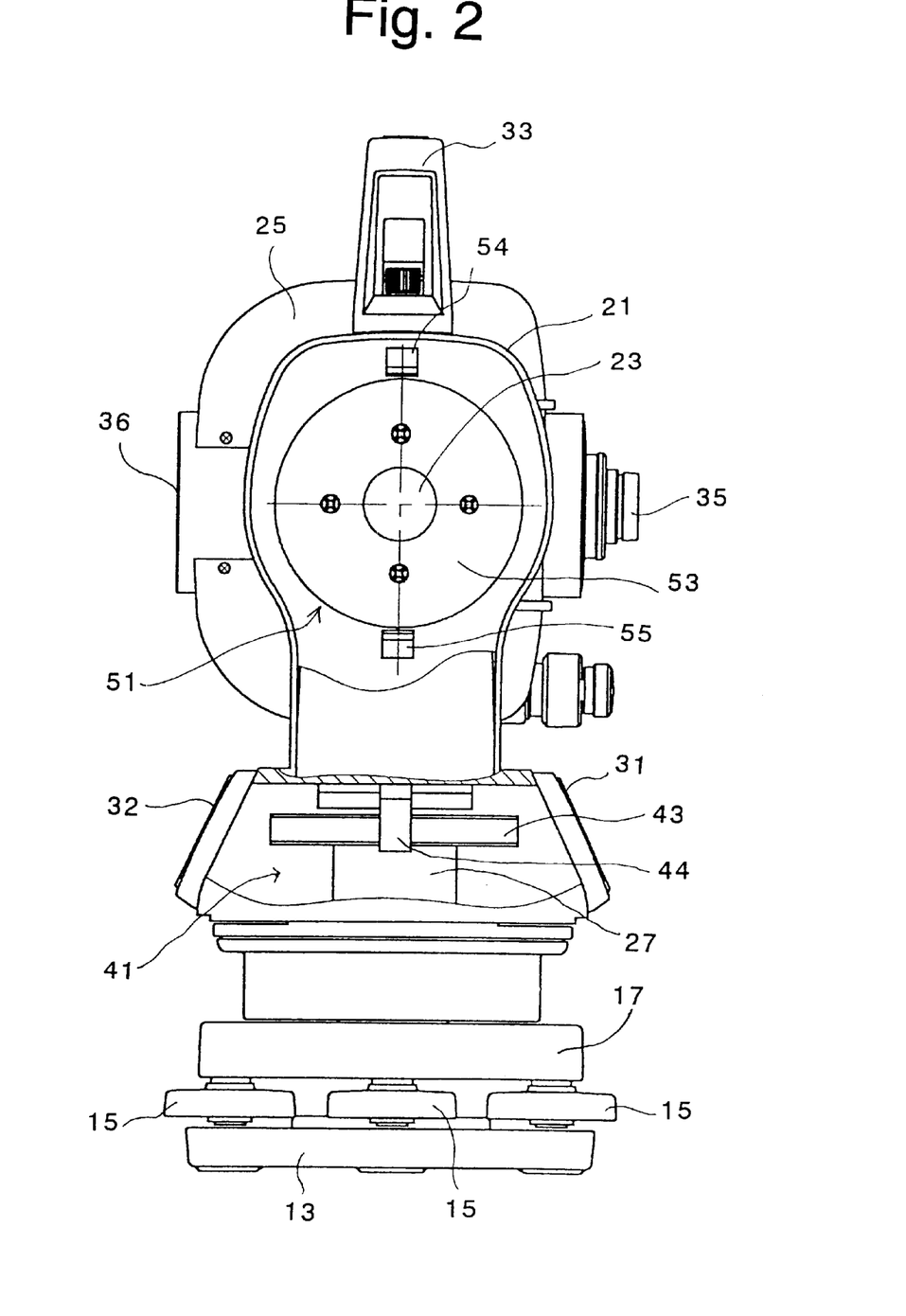
FIG. 2 is a side elevational view of the total station shown in FIG. 1, showing fundamental elements of each magnetic incremental rotary encoder in cross section.

FIGS. 1 and 2 show the first embodiment of a total station (including an optical instrument) which incorporates two magnetic incremental rotary encoders.

The total station 11 is provided with a base plate 13, a leveling board 17, a pedestal (body/stationary portion) 21 and a collimating telescope 25. The base plate 13 is connected to a tripod (not shown) when the total station 11 is mounted thereon. The base plate 13 is provided thereon with three leveling screws 15 on which the leveling board 17 is mounted. The pedestal 21 is mounted on the leveling board 17 via a vertical shaft 19 to be rotatable about the vertical shaft 19. The pedestal 21 is formed so as to have a general U-shaped cross section, and has a pair of supports 21a positioned on right and left sides as viewed in FIG. 1. The collimating telescope 25 is held by the pair of supports 21a therebetween to be rotatable about the axis of a pair of coaxial horizontal shafts 23 which are fixed to the right and left sides of the collimating telescope 25 as viewed in FIG. 1. The pair of coaxial horizontal shafts 23 are respectively supported by the pair of supports 21a to be rotatable about the axis thereof. In FIG. 1 only one of the pair of coaxial horizontal shafts 23 (the left shaft 23 as viewed in FIG. 1) is shown (in cross section).

The vertical shaft 19 is rotatably fitted in and supported by a vertical bearing 27 which is fixed to the leveling board 17. The base of the pedestal 21 which connects the pair of supports 21a is fixed to the upper end of the vertical shaft 19. Each horizontal shaft 23 is rotatably supported by a corresponding horizontal bearing 29 fixed to the corresponding support 21a. Accordingly, the collimating telescope 25 is supported by the pedestal 21 via the two horizontal shafts 23 and the two horizontal bearings 29 to be rotatable about the vertical shaft 19 and the horizontal shaft 23, which extend perpendicular to each other.

The total station 11 is provided on the vertical shaft 19 with a first magnetic incremental rotary encoder (first rotary encoder/horizontal-angle measuring device) 41 adapted for measuring the angle of rotation (horizontal angle) of the vertical shaft 19 (the pedestal 21 and the collimating telescope 25) with respect to the leveling board 17. The total station 11 is further provided on the horizontal shaft 23 with a second magnetic incremental rotary encoder (second rotary encoder/vertical-angle measuring device) 51 adapted for measuring the angle of rotation (vertical angle) of the horizontal shaft 23 (the collimating telescope 25) with respect to the pedestal 21. The first rotary encoder 41 is provided with a magnetic drum 43 fixed to the vertical shaft 19. The magnetic drum 43 is provided on the outer peripheral surface thereof with a multi-pole magnetized layer (not shown). The first rotary encoder 41 is further provided with two magnetic sensors 44 and 45 which are positioned to face the multi-pole magnetized layer with a slight gap between each magnetic sensor and the multi-pole magnetized layer on the opposite sides of the magnetic drum 43 (the right and left sides of the magnetic drum 43 as viewed in FIG. 1) with respect to the vertical shaft 19. The two magnetic sensors 44 and 45 are offset from each other by approximately 180 degrees about the vertical shaft 19. Likewise, the second rotary encoder 51 is provided with a magnetic drum (graduator disc) 53 fixed to the horizontal shaft 23. The magnetic drum 53 is provided on the outer peripheral surface thereof with a multi-pole magnetized layer 53a (see FIG. 3) which is identical to the multi-pole magnetized layer of the magnetic drum 43. The second rotary encoder 51 is further provided with two magnetic sensors 54 and 55 which are positioned to face the multi-pole magnetized layer 53a with a slight gap between each magnetic sensor and the multi-pole magnetized layer 53a on the opposite sides of the magnetic drum 53 (the upper and lower sides of the magnetic drum 53 as viewed in FIG. 1) with respect to the horizontal shaft 23. The two magnetic sensors 54 and 55 are offset from each other by approximately 180 degrees about the horizontal shaft 23.

Although the details are not shown in the drawings, the total station 11 is provided in the base of the pedestal 21 with an electronic circuit 61 (see FIG. 6) which includes an operational means for determining the angle of rotation of each of the first and second rotary encoders 41 and 51 (i.e., horizontal and vertical angles) by detecting the output voltage of each of the magnetic sensors 44, 45, 54 and 55. The total station 11 is provided on the front and rear faces of the pedestal 21 with operational panels 31 and 32, respectively (see FIG. 2). Each of the operational panels 31 and 32 is provided thereon with a keyboard which is manually operated by an operator to operate and control the total station 11, and a display (e.g., an LCD panel) for indicating the data input by the keyboard, the measured angles, etc.

As shown in FIGS. 1 and 2, the total station 11 is further provided with a grip 33 which is gripped when the total station 11 is carried, and a protection cover 34 which covers the pedestal 21 to protect the first rotary encoder 41 and battery (not shown) from dust. The collimating telescope 25 is provided with an objective lens 36 (see FIG. 2) and an eyepiece 35 (see FIG. 1).

Figure 3:
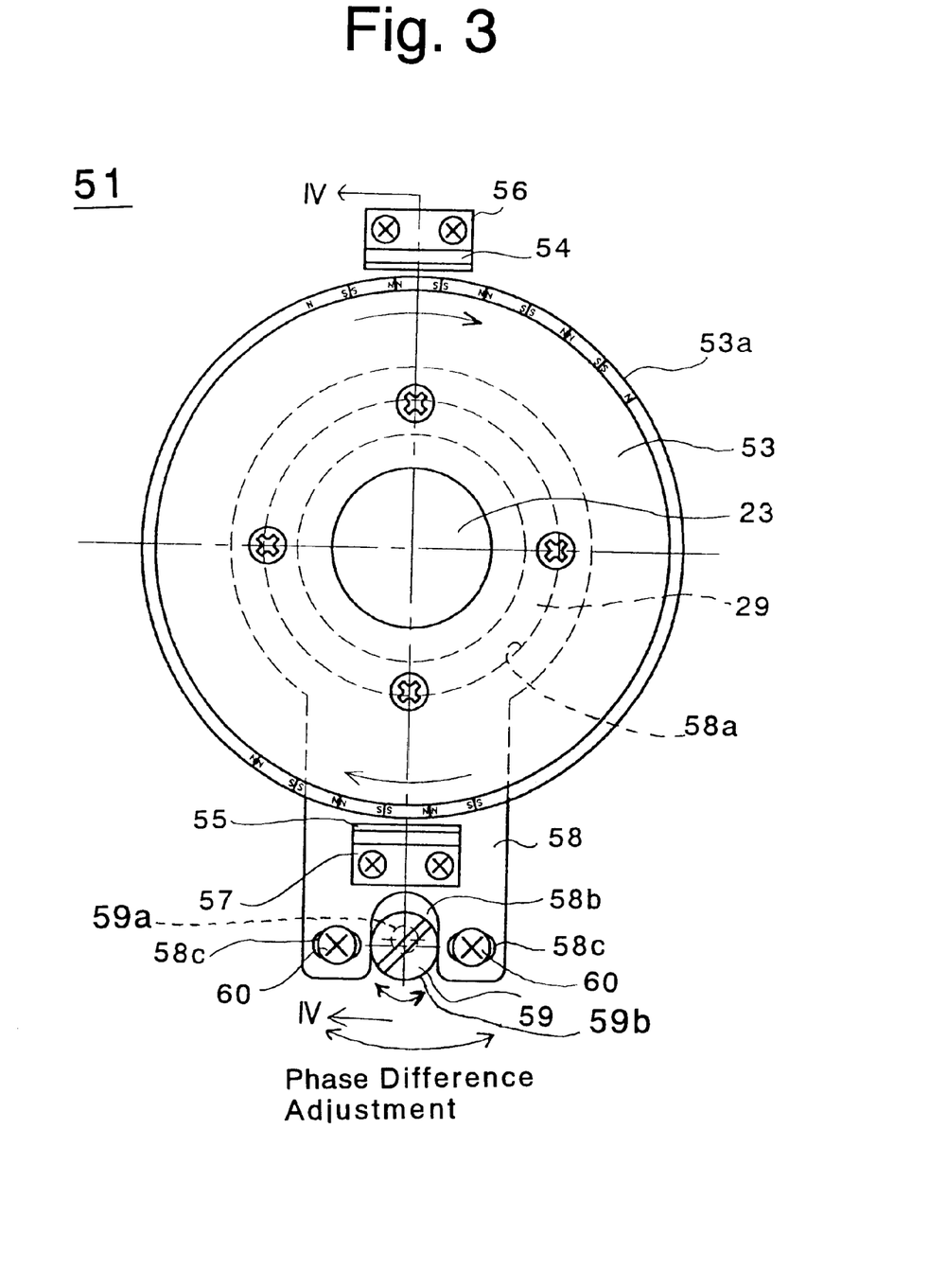
FIG. 3 is a plan view of an embodiment of a magnetic incremental rotary encoder shown in FIGS. 1 and 2.
Figure 4:
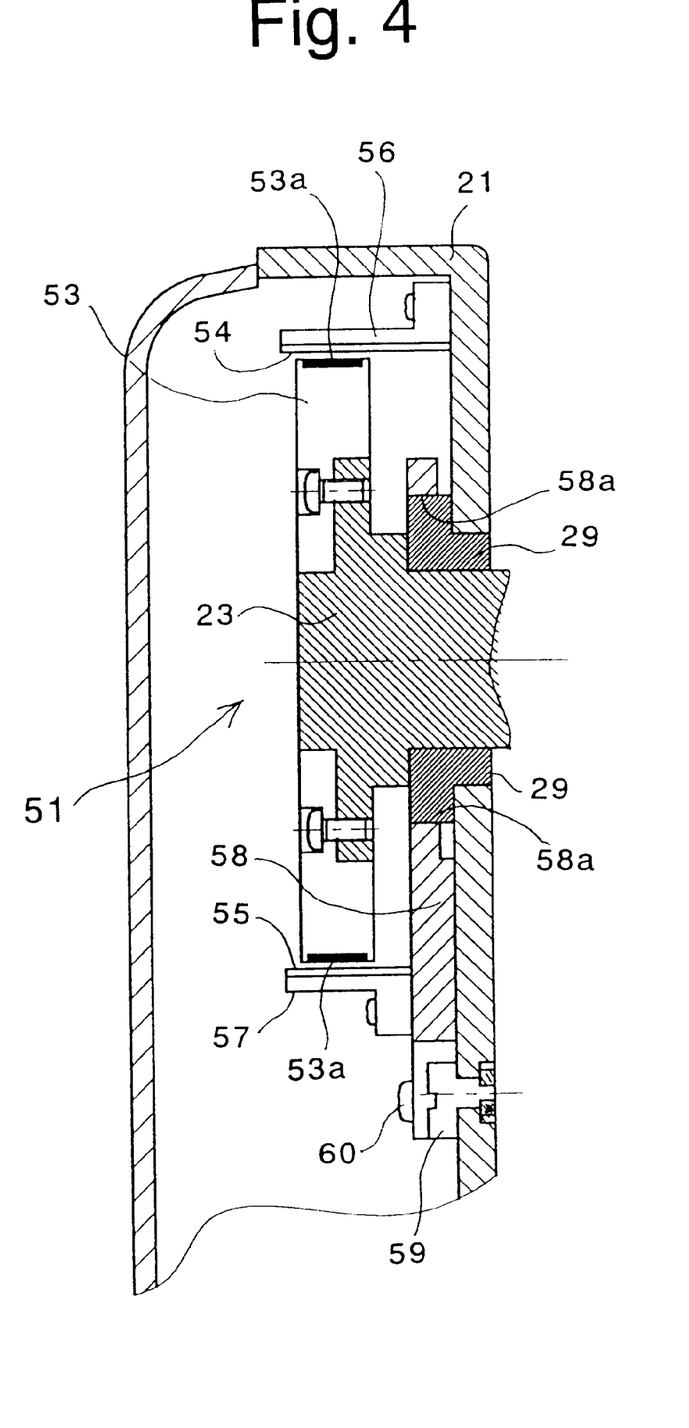
FIG. 4 is a cross sectional view of a magnetic incremental rotary encoder and peripheral components thereof shown in FIG. 1.
Figure 5:
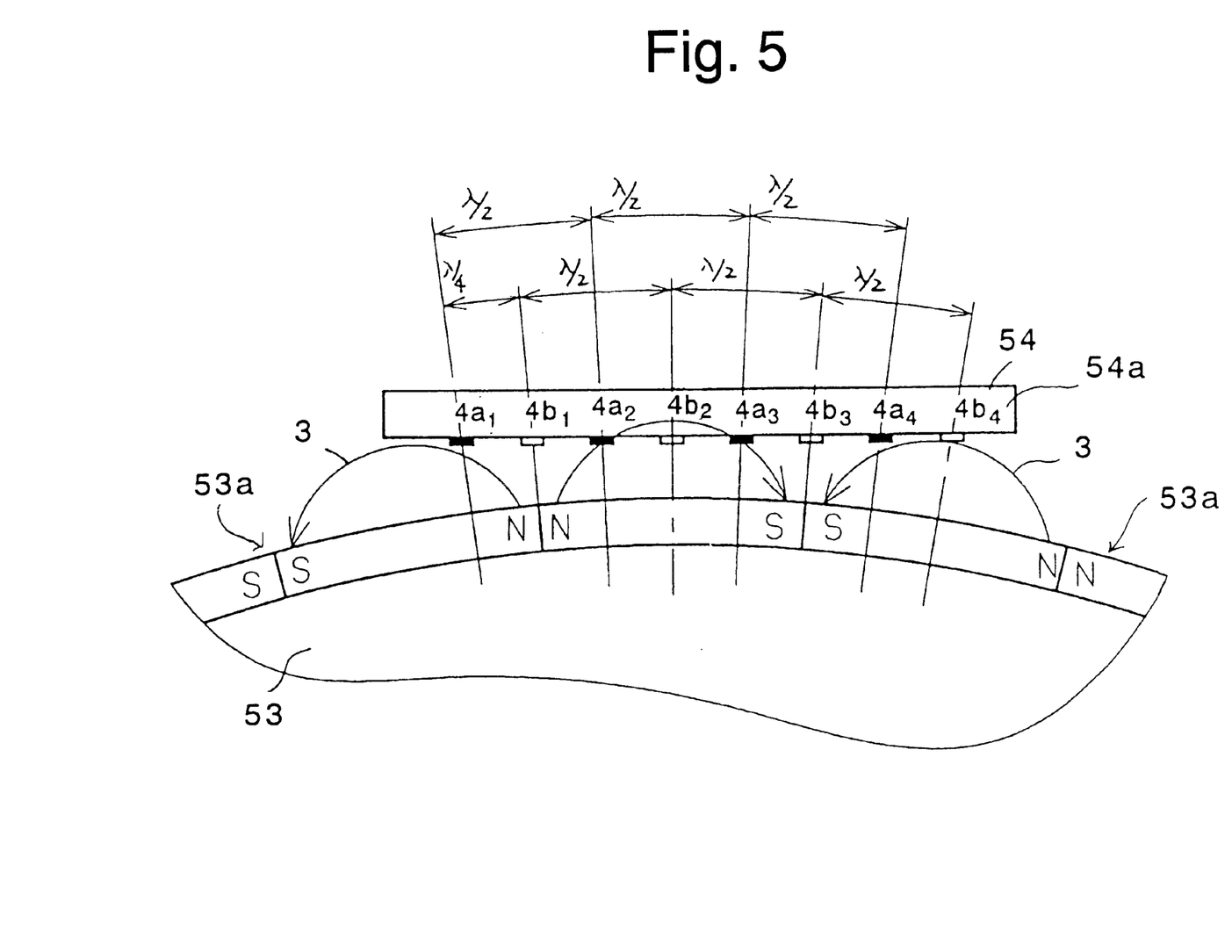
FIG. 5 is an explanatory view of fundamental portion of the magnetic incremental rotary encoder shown in FIG. 3, showing a relation between a magnetic sensor and the multi-pole magnetized layer of a magnetic drum.

The structure of each of the first and second rotary encoders 41 and 51 will be hereinafter discussed in detail with reference to FIGS. 3, 4 and 5. The fundamental structure of the first rotary encoder 41 is identical to that of the second rotary encoder 51, so that only the structure of the second rotary encoder 51 will be hereinafter discussed in detail. FIG. 3 is an enlarged plan view of the second rotary encoder 51 shown in FIG. 1 or 2. FIG. 4 is an enlarged cross sectional view of the second rotary encoder and peripheral components thereof shown in FIG. 1. FIG. 5 is an explanatory view of the magnetic sensor 54 and peripheral components thereof shown in FIG. 3, showing a relation between the multi-pole magnetized layer 53a and the magnetic sensor 54. The first and second magnetic sensors 54 and 55 are fixed to angles 56 and 57, respectively. The first magnetic sensor 54 is fixed to the pedestal 21, via the angle 56, while the second magnetic sensor 55 is fixed to the base plate 58 via the angle 57.

The second rotary encoder 51 is provided, on an outer peripheral surface of the magnetic drum 53 thereof, with the multi-pole magnetized layer 53a having a plurality of magnetized divisions equally divided by the number of divisions N ("N" being a positive integer). The pitch of the magnetized divisions (i.e., the pitch of two adjacent borders of the magnetic poles) of the multi-pole magnetized layer 53a is herein assumed to be "λ". The first magnetic sensor 54 is positioned to face the multi-pole magnetized layer 53a with a slight gap between the first magnetic sensor 54 and the multi-pole magnetized layer 53a. The first magnetic sensor 54 is provided with a plane board 54a and eight magnetoresistor elements $4a_1$, $4a_2$, $4a_3$, $4a_4$, $4b_1$, $4b_2$, $4b_3$ and $4b_4$. These eight magnetoresistor elements are located at λ/4 intervals on that surface of the plane board 54a which faces the multi-pole magnetized layer 53a so that the straight line which substantially perpendicularly penetrates through the center of each magnetoresistor element passes through the rotational axis of the magnetic drum 53.

If the magnetic drum 53 rotates, the second rotary encoder 51 detects the variation of the resistance values of the eight magnetoresistor elements $4a_1$, $4a_2$, $4a_3$, $4a_4$, $4b_1$, $4b_2$, $4b_3$ and $4b_4$, which vary in accordance with the variation of the magnetic field 3 generated by the multi-pole magnetized layer 53a, to thereby determine the rotational angle of the magnetic drum 53 at λ/4 pitch. An angle smaller than the pitch (λ/4) is determined according to an interpolative calculation.

Throughout the specification, "pitch λ" refers to the pitch angle.

The eight magnetoresistor elements $4a_1$, $4a_2$, $4a_3$, $4a_4$, $4b_1$, $4b_2$, $4b_3$ and $4b_4$ can be divided into two groups, i.e., an A-phase and a B-phase which have a phase difference of λ/4 or λ(3/4) therebetween. The four magnetoresistor elements $4a_1$, $4a_2$, $4a_3$ and $4a_4$ of the A-phase and the four magnetoresistor elements $4b_1$, $4b_2$, $4b_3$ and $4b_4$ of the B-phase are alternately arranged. The four magnetoresistor elements $4a_1$, $4a_2$, $4a_3$ and $4a_4$ of the A-phase are arranged at λ/2 intervals and the four magnetoresistor elements $4b_1$, $4b_2$, $4b_3$ and $4b_4$ of the B-phase are also arranged at λ/2 intervals.

Figure 6:
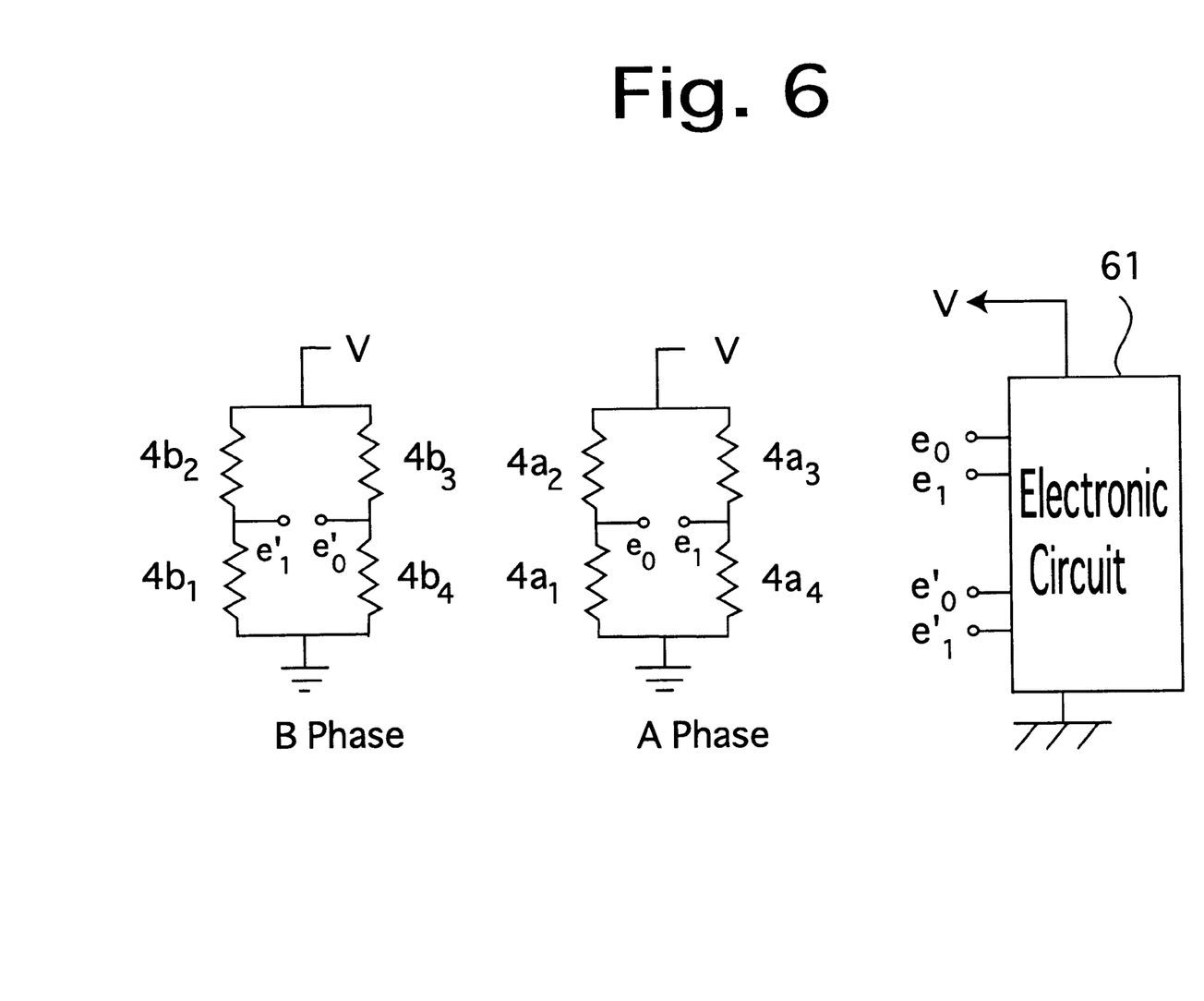
FIG. 6 is a schematic circuit diagram of an embodiment showing the electrical connection of an electronic circuit with magnetoresistor elements.

As shown in FIG. 6, the four magnetoresistor elements $4a_1$, $4a_2$, $4a_3$ and $4a_4$ of the A-phase are connected in the form of a bridge circuit while the four magnetoresistor elements $4b_1$, $4b_2$, $4b_3$ and $4b_4$ of the B-phase are also connected in the form of a bridge circuit. The electric circuit 61 applies a constant voltage V between the terminals of each of the two bridge circuits. The electric circuit 61 detects a variation of the magnetic field, i.e., a variation of the angle of rotation of the magnetic drum 53 in accordance with the voltage across terminals $e_0$ and $e_1$ of the A-phase and the voltage across terminals $e_0'$ and $e_1'$ of the B-phase.

According to this illustrated embodiment, the respective resistance values $a_1$, $a_2$, $a_3$ and $a_4$ of the four magnetoresistor elements $4a_1$, $4a_2$, $4a_3$ and $4a_4$ of the A-phase vary in dependence on the variation of the magnetic field 3 generated by the rotation of the magnetic drum 53, in accordance with the following equations:

$$a_1 = R_0 + R\sin(N\omega)$$

$$a_2 = R_0 + R\sin(N\omega + \pi) = R_0 - R\sin(N\omega)$$

$$a_3 = R_0 + R\sin(N\omega + 2\pi) = R_0 + R\sin(N\omega)$$

$$a_4 = R_0 + R\sin(N\omega + 3\pi) = R_0 - R\sin(N\omega)$$

wherein "ω" represents the angle of rotation of the magnetic drum 53, "$R_0$" represents the resistance value in the case of no magnetic field, "R" represents the resistance ratio (coefficient), and "N" represents the number of magnetized divisions of the multi-pole magnetized layer 53a.

If the difference in output between the terminals $e_0$ and $e_1$ is amplified, the output of the A-phase can be represented by the following equation:

$$A_{out} = \alpha \times 2 \times R \times V / R_0 \times \sin(N\omega)$$

wherein "$A_{out}$" represents the output of the A-phase, "α" represents the amplification factor.

The magnetoresistor elements $4b_1$, $4b_2$, $4b_3$ and $4b_4$ of the B-phase are respectively offset from the magnetoresistor elements $4a_1$, $4a_2$, $4a_3$ and $4a_4$ of the A-phase by π/2, so that the output of the B-phase can be represented by the following equation:

$$B_{out} = \alpha \times 2 \times R \times V / R_0 \times \cos(N\omega)$$

wherein "$B_{out}$" represents the output of the B-phase.

The angle of rotation of the magnetic drum 53 can be determined at a pitch of N/4 by detecting the zero crossing points of the outputs of the A-phase and the B-phase. Accordingly, the detection pitch is four times smaller than (i.e., a quarter of) the number of divisions N to realize a high resolution. In surveying instruments, a detection pitch which is smaller than a quarter of the number of divisions N is sometimes required. To satisfy such a demand, in the illustrated embodiment, the number of divisions (detection pitch) is increased using the following equation based on the A-phase and the B-phase.

$$\tan^{-1}(A_{out}/B_{out})$$

The structure of the second magnetic sensor 55 is identical to the structure of the first magnetic sensor 54. However, the first and second magnetic sensors 54 and 55 are different in that the position of the second magnetic sensor 55 is adjustable to adjust the phase difference. This adjusting mechanism will be hereinafter discussed.

The base plate 58, to which the second magnetic sensor 55 is fixed, is provided at one end thereof (the upper end as viewed in FIG. 3) with a circular hole 58a and is slidably fitted on one of the two horizontal bearings 29 (the left horizontal bearing 29 as viewed in FIG. 1) to be rotatable about the horizontal shaft 23. Namely, the base plate 58 can rotate about the axis of the horizontal shaft 23 with the inner peripheral surface of the circular hole 58a snugly fitted onto the outer peripheral surface of the horizontal bearing 29. The base plate 58 is further provided at the other end thereof with two adjusting slots 58c, and a slit 58b positioned between the two adjusting slots 58c. The two adjusting slots 58c are formed to extend along a circle about the axis of the horizontal shaft 23. An eccentric pin 59 is fixed to the pedestal 21 to be rotatable about a rotational shaft 59a of the eccentric pin 59. The eccentric pin 59 is fitted in the slit 58b of the base plate 58. Two set screws 60 are screwed into the pedestal 21 through the two adjusting slots 58c, respectively. Therefore, in a state where the two set screws 60 are loosened, rotating the eccentric pin 59 causes the base plate 58 to rotate (swing) about the axis of the horizontal shaft 23 to thereby move the second magnetic sensor 55 on a circle about the axis of the horizontal shaft 23 with the gap between the second magnetic sensor 55 and the multi-pole magnetized layer 53a being maintained constant. This makes it possible to adjust the phase of the output voltage of the second magnetic sensor 55. In the adjusting operation of the second magnetic sensor 55, once the second magnetic sensor 55 has been moved to a position at which a desired phase of the output voltage of the second magnetic sensor 55 is obtained, the two set screws 60 are tightened to fix the base plate 58 to the pedestal 21. According to the above-described manner, the phase of the output voltage of the second magnetic sensor 55 can be easily adjusted by rotating the eccentric pin 59.

Figure 7:
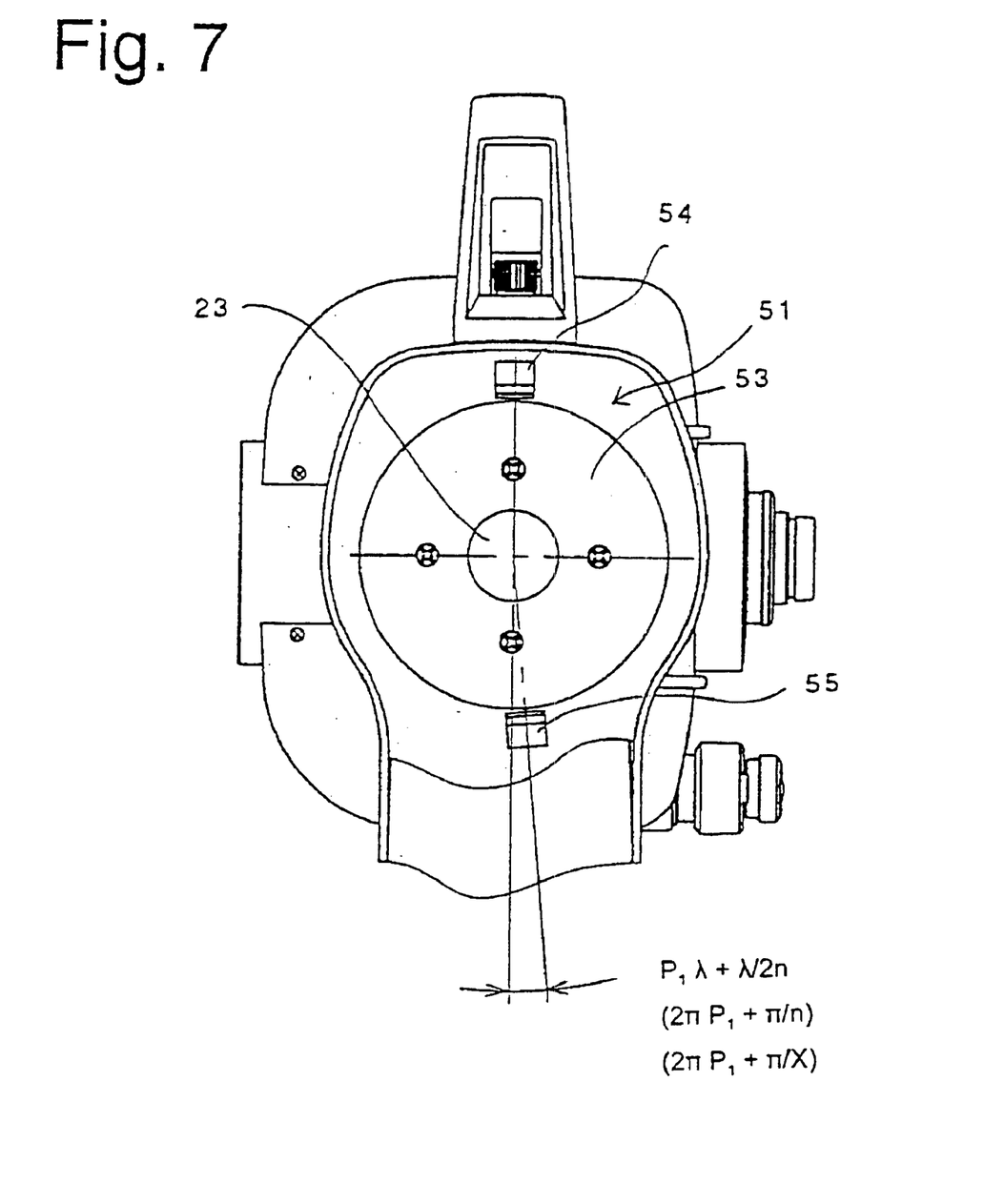
FIG. 7 is a side elevational view of part of the total station shown in FIG. 2, showing an embodiment of an arrangement of the first and second magnetic sensors which compensate for an error due to eccentricity of the magnetic drum and n-order harmonic distortion.

An error due to the eccentricity of the magnetic drum 53 and n-order harmonic distortion are simultaneously compensated for using the detected output voltages of the first and second magnetic sensors 54 and 55, which are offset from each other by 180 degrees about the axis of the horizontal shaft 23. FIG. 7 shows an embodiment of an arrangement of the first and second magnetic sensors 54 and 55 in the first embodiment of the total station for simultaneously compensating error due to the eccentricity of the magnetic drum 53 and n-order harmonic distortion.

In this embodiment, the second magnetic sensor 55 is positioned so as to be offset from the initial position thereof (i.e., the position that is offset from the position of the first magnetic sensor 54 by approximately 180 degrees) so that the phase of the output voltage (sign curve) of the second magnetic sensor 55 advances or delays with respect to the phase of the output voltage (sign curve) of the first magnetic sensor 54 by $P_1\lambda + \lambda/2n$ (or $2\pi P_1 + \pi/n$). In this equation "$P_1$" is an integral number.

The detection error component $\epsilon_0$ of the first magnetic sensor 54 can be represented by the following equation:

$$\epsilon_0 = e \times \sin(\omega) + (\delta_1 \times \sin(N\omega) + \delta_2 \times \sin(2N\omega) \ldots + \delta_n \times \sin(nN\omega)) \quad (1)$$

wherein "ω" represents the angle of the graduator disc (the magnetic drum 53); "e" represents the error due to the eccentricity of the graduator disc (the magnetic drum 53);

"$\delta_n$" represents the n-order harmonic distortion; and "N" represents the number of magnetized divisions of the multi-pole magnetized layer 53a of the magnetic drum 53 (which is equal to a half of the number of the magnetic poles of the multi-pole magnetized layer 53a).

For instance, in the case of the n-order harmonic distortion being large, if it is desired to compensate for such a harmonic distortion, the position of the second magnetic sensor 55 is adjusted so that the phase of the output voltage of the second magnetic sensor 55, which is offset from the first magnetic sensor 54 by approximately 180 degrees about the horizontal shaft 23, advances or delays with respect to the phase of the output voltage of the first magnetic sensor 54 by $\pi/n$. The detection error component $\epsilon_{180}$ of the second magnetic sensor 55 can be represented by the following equation:

$$\epsilon_{180} = e \times \sin(\omega + 2\pi P/N + \pi) + (\epsilon_1 \times \sin(N(\omega + 2\pi P/N + \pi + \pi/Nn)) + (\delta \times \sin(2N(\omega + 2\pi P/N + \pi + \pi/Nn)) + \ldots + (\delta_n \times \sin(nN(\omega + 2\pi P/N + \pi + \pi/Nn)) + \ldots) \quad (2)$$

wherein "P" represents an integral number ("$2\pi P$" represents the slight offset from the initial position of the second magnetic sensor 55 which is offset from the position of the first magnetic sensor 54 by approximately 180 degrees).

If the number of divisions N is herein defined to be an even number because it is generally used as the number of divisions N, the detection error component $\epsilon_{180}$ of the second magnetic sensor 55 can be represented by the following equation:

$$\epsilon_{180} = -e \times \sin(\omega + 2\pi P/N) + (\delta_1 \times \sin(N\omega + \pi/n) + \delta_2 \times \sin(2N\omega + 2\pi/n)) \ldots -\delta_n \times \sin(nN\omega) \ldots) \quad (3)$$

In equations (1) and (2) for the first and second magnetic sensors 54 and 55, if the average of the values of "$\epsilon_0$" and "$\epsilon_{180}$" is taken on condition that the equation "$0 < 2\pi P/N << 2\pi$" is satisfied, the following equation is satisfied:

$$(\epsilon_0 + \epsilon_{180})/2 = (\delta_1 \times \sin$$

$$(N\omega) + \sin(N\omega + \pi/n)) + (\delta_2 \times \sin$$

$$(2N\omega) + \sin(2N\omega + 2\pi/n)) + \ldots + (\delta_{n-1} \times \sin$$

$$((n-1)N\omega) + \sin((n-1)N\omega + (n-1)\pi/n)) \text{ps}$$

$$-(\delta_{n+1} \times \sin((n+1)N\omega) + \sin((n+1)n\omega +$$

$$(n+1)\pi/n) \ldots /2 \quad (4)$$

Consequently, the error "e" due to the eccentricity of the magnetic drum 53 and the n-order harmonic distortion "$\delta$" are compensated simultaneously.

A person skilled in the art may think of compensating for harmonic distortion by using a single magnetic sensor having an increased number of magnetoresistor elements provided on the single magnetic sensor. However, since the sensing surface of the magnetic sensor, on which the magnetoresistor elements are mounted, is flat, if the width of the magnetic sensor is expanded to allow a number of magnetoresistor elements to be mounted in line on the sensing surface, the magnetic field generated by the magnetic drum does not act equally on each of the magnetoresistor elements mounted on the flat sensing surface of the magnetic sensor because the outer peripheral surface of the magnetic drum, on which the multi-pole magnetized layer is formed, has a curvature to thereby generate a difference in thickness between a center gap between the center magnetoresistor element and the outer peripheral surface of the magnetic drum and a side gap between either end magnetoresistor element and the outer peripheral surface of the magnetic drum. This results in a factor of detection errors. To prevent such a problem from occurring, according to the first embodiment, harmonic distortion can be properly compensated for using the second magnetic sensor 55, which is offset from the first magnetic sensor 54 about the axis of the horizontal shaft 23 by approximately 180 degrees.

In addition to the above, the accuracy of measurement by the magnetic sensors cannot be precisely determined before the magnetic incremental rotary encoder is assembled. Furthermore, sometimes harmonic distortion other than that which is predicted beforehand occurs.

According to the first embodiment, even if unpredicted harmonic distortion occurs, this can be compensated for by adjusting the position of the second magnetic sensor 55, so that it is unnecessary to rework the magnetic sensor or replace the same by a new one.

Figure 8:
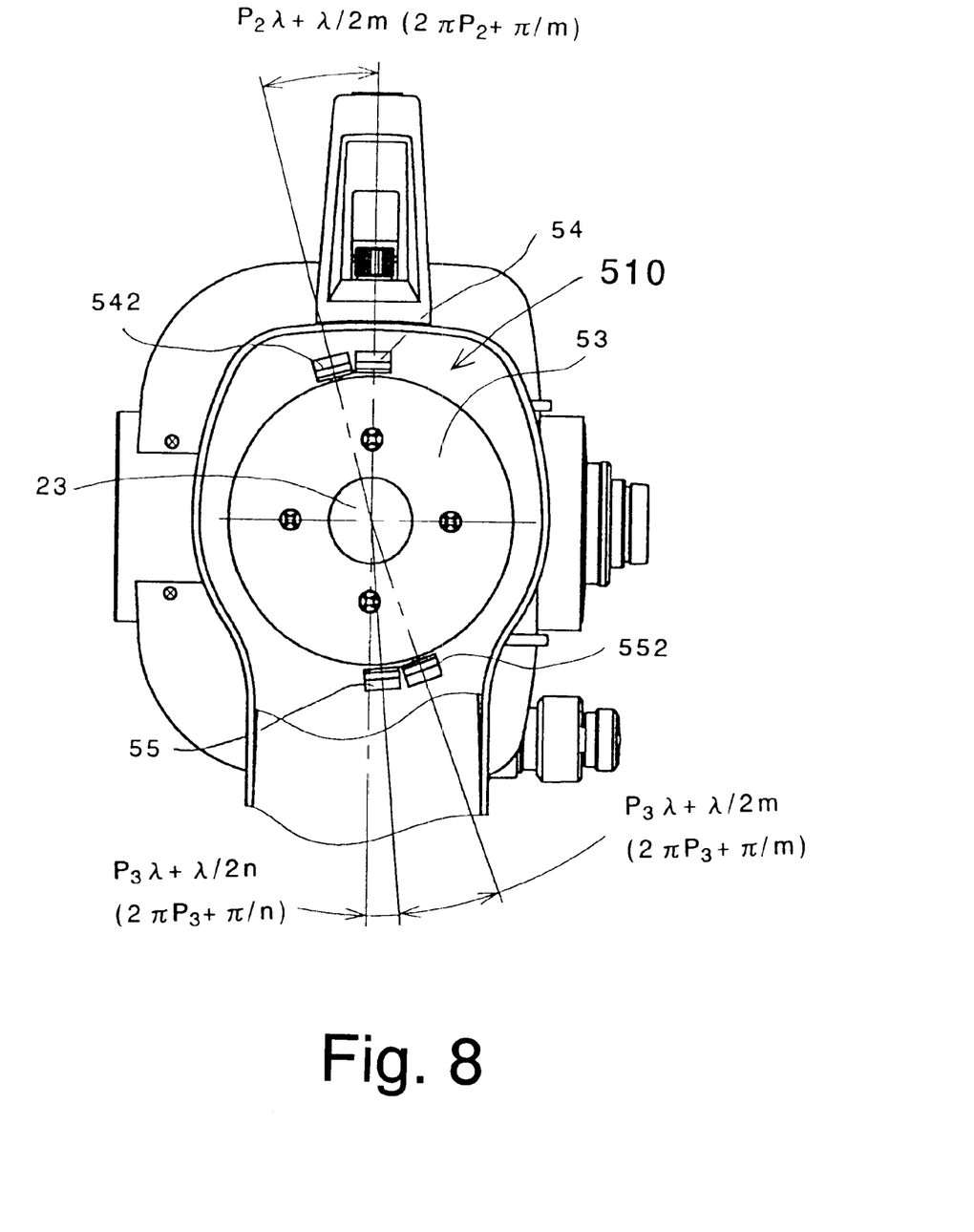
FIG. 8 is a side elevational view of part of a total station according to the second embodiment, showing an arrangement of two pairs of magnetic sensors which compensate for an error due to the eccentricity of the magnetic drum, n-order harmonic distortion and m-order harmonic distortion.

The second embodiment of the total station to which the present invention is applied, in which n-order harmonic distortion and m-order harmonic distortion can be compensated for, will be hereinafter discussed with reference to FIG. 8. The second embodiment is identical to the first embodiment except that the second magnetic incremental rotary encoder of the second embodiment has a different structure from that of the first embodiment shown in FIGS. 1 through 6, hence, in the second embodiment elements or components similar to those in the first embodiment are designated by the same reference numerals.

The second magnetic incremental rotary encoder (hereinafter referred to as simply "second rotary encoder") 510 of the second embodiment is provided with two pairs of magnetic sensors: a first pair of magnetic sensors (the first and second magnetic sensors) 54 and 55 and a second pair of magnetic sensors (the third and fourth magnetic sensors) 542 and 552. The second magnetic sensor 55 is positioned to be offset from the initial position thereof (i.e., the position which is offset from the position of the first magnetic sensor 54 by approximately 180 degrees) so that the phase of the output voltage (sign curve) of the second magnetic sensor 55 advances or delays with respect to the phase of the output voltage (sign curve) of the first magnetic sensor 54 by $P_3 \lambda + \lambda/2n$ (or $2\pi P_3 + \pi/n$). In this equation "$P_3$" is an integral number. On the other hand, the third magnetic sensor 542 is positioned to be offset so that the phase of the output voltage (sign curve) of the third magnetic sensor 542 advances or delays with respect to the phase of the output voltage (sign curve) of the first magnetic sensor 54 by $P_2 \lambda + \lambda/2m$, while the fourth magnetic sensor 552 is positioned to be offset so that the phase of the output voltage (sign curve) of the fourth magnetic sensor 552 advances or delays with respect to the phase of the output voltage (sign curve) of the second magnetic sensor 55 by $P_3 \lambda + \lambda/2m$. In these equations, "P2" and "$P_3$" are integral numbers.

Since the phase of the output voltage of the second magnetic sensor 55, which is offset from the first magnetic sensor 54 by approximately 180 degrees about the horizontal shaft 23, advances or delays with respect to the phase of the output voltage of the first magnetic sensor 54 by $\pi/n$, the error "e" due to the eccentricity of the magnetic drum 53 and the n-order harmonic distortion "$\delta$" are compensated for at the same time by taking the average of the detected output voltages of the first and second magnetic sensors 54 and 55. The average $\omega_0$ of the detected output voltages of the first and second magnetic sensors 54 and 55 is calculated according to the following equation:

$$\omega_0 = (\omega_1 + \omega_2)/2$$

wherein $\omega_1$ designates the first magnetic sensor 54, and $\omega_2$ designates the second magnetic sensor 55.

Since the phase of the output voltage of the third magnetic sensor 542 advances or delays with respect to the phase of the output voltage of the fourth magnetic sensor 552 by $\pi/n$, the error "e" due to the eccentricity of the magnetic drum 53 and the n-order harmonic distortion "$\delta$" are compensated for at the same time by taking the average $\omega_{180}$ of the detected output voltages of the third and fourth magnetic sensors 542 and 552. The average $\omega_{180}$ of the detected output voltages of the third and fourth magnetic sensors 542 and 552 is calculated according to the following equation:

$$\omega_{180}=(\omega_3+\omega_4)/2$$

wherein $\omega_3$ designates the first magnetic sensor 542, and $\omega_4$ designates the second magnetic sensor 552.

Further, since the phase of the output voltage of the first magnetic sensor 54 advances or delays with respect to the phase of the output voltage of the third magnetic sensor 542 by $\pi/m$ and since the phase of the output voltage of the second magnetic sensor 55 advances or delays with respect to the phase of the output voltage of the fourth magnetic sensor 552 by $\pi/m$, the error "e" due to the eccentricity of the magnetic drum 53 and the m-order harmonic distortion "$\delta$" are compensated for at the same time by taking the average of the detected output voltages of the first through fourth magnetic sensors 54, 55, 542 and 552. The average $\omega$ of the detected output voltages of the first through fourth magnetic sensors 54, 55, 542 and 552 is calculated according to the following equation:

$$\omega=(\omega_0+\omega_{180})/2=(\omega_1+\omega_2+\omega_3+\omega_4)/4$$

According to the above process, the error due to the eccentricity of the magnetic drum 53, the n-order harmonic distortion and also the m-order harmonic distortion can be compensated for at the same time. If it is desired to increase the number of harmonic distortions to be compensated for, the number of pairs of magnetic sensors needs only to be increased. For instance, if the number of harmonic distortions to be compensated for is "n", the number of the pairs of magnetic sensors should be "$2^n$" (the $n^{th}$ power of 2) so that the magnetic sensors are arranged around the magnetic drum 53 to have the phase difference and then take the average of the detected output voltages of the magnetic sensors in a manner similar to the case of the four magnetic sensors shown in FIG. 8.

A specific example of the first embodiment of the rotary encoder using the second rotary encoder 51 which is suitable for the case where more than one type of harmonic distortion occurs will be hereinafter discussed. In this embodiment, the case where the second-order harmonic distortion and also the third-order harmonic distortion occur equivalently will be hereinafter discussed. Table 1 shows the value of phase difference of the first and second magnetic sensors 54 and 55 ($\pi/2$, $\pi/3$ or $\pi/2.5$), the value of the remaining second-order harmonic distortion, the value of the remaining third-order harmonic distortion, and the root-mean-square value of the sum of these two harmonic distortions in each of the cases where the second-order harmonic distortion is solely eliminated, where the third-order harmonic distortion is solely eliminated and where a harmonic distortion between the second-order harmonic distortion and the third-order harmonic distortion (i.e., the middle-order harmonic distortion) is eliminated. In Table 1, each of the values of the remaining second-order harmonic distortion and the remaining third-order harmonic distortion is 1 in the case where each harmonic distortion is not compensated for.

TABLE 1

Remaining Error After Compensating for Harmonic Distortion by Phase Difference

| Harmonic Distortion to be Compensated for | Phase Difference Between $1^{st}$ & $2^{nd}$ Magnetic Sensors | Remaining $2^{nd}$ Order Harmonic Distortion | Remaining $3^{rd}$ Order Harmonic Distortion | $2^{nd}$ Order Harmonic Distortion + $3^{rd}$ Order Harmonic Distortion R.M.S. |
|---|---|---|---|---|
| Compensate Only for $2^{nd}$ Order Harmonic Distortion | $\pi/2$ | 0 | 0.707 | 0.707 |
| Compensate Only for $3^{rd}$ Order Harmonic Distortion | $\pi/3$ | 0.707 | 0 | 0.707 |
| Compensate for Harmonic Distortion Between $2^{nd}$ Order & $3^{rd}$ Order Distortion | $\pi/2.5$ | 0.309 | 0.309 | 0.437 |

As can be appreciated from Table 1, the root-mean-square value of the sum of the second-order harmonic distortion and the third-order harmonic distortion in the case where the middle-order harmonic distortion is eliminated is smaller than that in the case where the second-order harmonic distortion or the third-order harmonic distortion is eliminated.

Although the case where the second-order harmonic distortion and the third-order harmonic distortion occur equivalently has been discussed above in the third embodiment of the total station, the actual condition of occurrence of the harmonic distortions varies. Therefore, it is necessary to perform an adjusting operation in which the angle of rotation of the magnetic drum 53 is detected by a high-precision angle check device. In this adjusting operation, the angle of rotation of the magnetic drum 53 which is detected by the angle check device is compared with that detected using the first and second magnetic sensors 54 and 55 to adjust the phase of the output voltage of the second magnetic sensor 55 so as to make the harmonic distortions minimal. In the embodiment shown in FIG. 3, such an adjusting operation is carried out by rotating the eccentric pin 59 to adjust the phase of the output voltage of the second magnetic sensor 55.

According to the magnetic incremental rotary encoder of the first embodiment, even if a harmonic distortion which could not be predicted at the design stage occurs, the harmonic distortion can be compensated for during, or even after the assembly of the encoder.

Table 2 shows an example of the number of divisions N of a magnetic incremental rotary encoder, which corresponds to the number of a plurality of magnetized divisions of the multi-pole magnetized layer 53a of the magnetic drum

Figure 9:
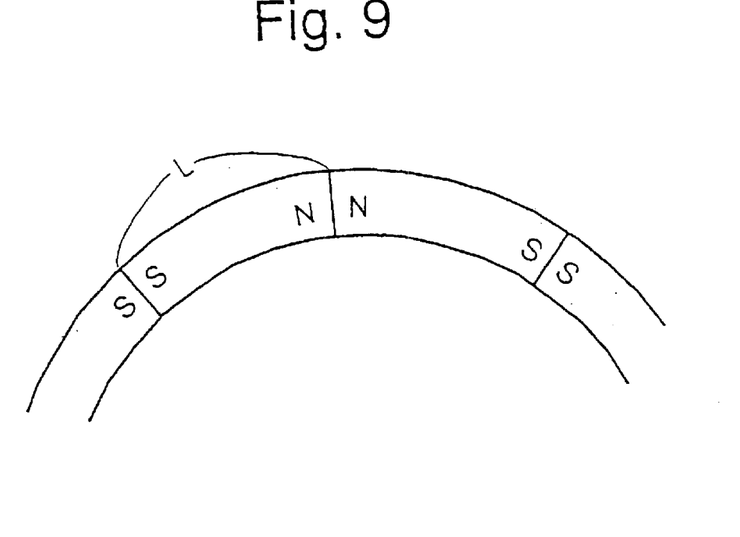
FIG. 9 is a plan view of part of the magnetic drum of a total station which incorporates two magnetic incremental rotary encoders to which the present invention is applied, showing a pitch L of a plurality of magnetized divisions of the multi-pole magnetized layer of the magnetic drum.

53. FIG. 9 shows a pitch L of the plurality of magnetized divisions of the multi-pole magnetized layer 53*a* of the magnetic drum 53.

TABLE 2

| Number of Divisions N | Seconds per Pitch | Pitch L (μm) when Outer Diameter of Magnetic Drum is 82.4 mm | Pitch L (μm) when Outer Diameter of Magnetic Drum is 100 mm |
|---|---|---|---|
| 1620 | 800 sec. | 160 | 194 |
| 1800 | 720 sec. | 144 | 175 |
| 2160 | 600 sec. | 120 | 145 |
| 3240 | 400 sec. | 80 | 97 |
| 3600 | 360 sec. | 72 | 87 |
| 4050 | 320 sec. | 64 | 78 |

In order to reduce the dispersion of the distances between the outer peripheral surface of the magnetic drum 53 and the magnetoresistor elements fixed on each magnetic sensor, that is cause by the fact that the sensing surface of the magnetic sensor is flat while the outer peripheral surface of the magnetic drum 53 is curved, it is preferable that the outer diameter of the magnetic drum 53 be made as large as possible within a limited space of the total station in which the magnetic encoder is accommodated and at the same time that the pitch of the plurality of magnetized divisions of the multi-pole magnetized layer 53*a* be made as small as possible. To this end, in the case where the magnetic incremental rotary encoder is incorporated in a standard sized surveying instrument such as the total station shown in FIGS. 1 and 2, it is preferable that the following condition is satisfied:

$$60 < L < 250 \ (\mu m)$$

wherein "L" represents the pitch of the plurality of magnetized divisions of the multi-pole magnetized layer of the magnetic drum.

If the pitch L becomes shorter than 60 μm, the positions of the magnetic sensors relative to the magnetic drum have to be minutely adjusted with extreme precision, and at the same time, the magnetoresistor elements mounted on each magnetic sensor have to be arranged thereon with extreme precision, which makes it difficult to produce the magnetic incremental rotary encoder. On the other hand, if the pitch L becomes greater than 250 μm, in the adjusting operation in which the positions of the magnetic sensors are adjusted while monitoring the Lissajous's figures (or Bowditch curves) of the output values of the magnetic sensors on the screen of an oscilloscope, the occurrence of a slight variation in the Lissajous's figures causes error to vary largely, so that the difference (phase difference) among the Lissajous's figures cannot be visually determined. This makes it difficult to perform the adjusting operation with high precision. In this case, in order to perform the adjusting operation with high precision to thereby reduce error, the diameter of the magnetic drum has to be increased, which leads to making the size of the total station large.

According to the illustrated embodiments to which the present invention is applied, such problems will not occur since the pitch L falls within the range shown by the aforementioned condition (60 μm<L<250 μm).

As can be understood from the foregoing, according to the illustrated embodiments, since the two sensors of the rotary encoder are offset from each other so that the phase of output voltage of one of the two sensors advances or delays with respect to the phase of output voltage of the other by π/X (X ≧1.0) and since the outputs of the two sensors are added to take an average thereof, the error due to the eccentricity of the graduator disc and also the n-order harmonic distortion can be compensated for at the same time even with a small number of sensors. Moreover, since the harmonic distortion can be compensated for, the precision of the interpolative calculation becomes high. Therefore, the magnetic encoder in which it is difficult to increase the number of magnetized divisions of the multi-pole magnetized layer can be a high-precision magnetic encoder. Furthermore, since it is not necessary to increase the number of sensors, the influence of error due to deviation of the magnetic resistance curve from the ideal value thereof and/or the curvature of the outer peripheral surface of the magnetic drum can be made small, in the case where the present invention is applied to the magnetic incremental rotary encoder. In the illustrated embodiments, the phase difference of the sensors can be adjusted, so that even if a harmonic distortion which could not be predicted in the stage of designing the encoder occurs, the harmonic distortion can be compensated for. If a plurality of pairs of sensors are provided, a plurality of harmonic distortions can be easily compensated for.

Still furthermore, the magnetic incremental rotary encoder is light-weight compared with an optical incremental rotary encoder and consumes less space in the axial direction, so that a surveying instrument which incorporates the magnetic incremental rotary encoder can be designed small and compact to thereby be carried easily.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An incremental rotary encoder comprising:
    a rotary portion;
    a first sensor; and
    a second sensor that is positioned opposite from said first sensor with respect to an axis of said rotary portion;
    wherein said second sensor is offset from said first sensor so that a phase of output voltage of said second sensor advances or delays with respect to a phase of output voltage of said first sensor by $\lambda/2n$ to compensate for an n-order harmonic distortion, wherein a pitch of the harmonic distortion is $\lambda/n$, and n represents any order harmonic distortion.

2. The incremental rotary encoder according to claim 1, further comprising a third sensor and a forth sensor, independent of said first and second sensors, the fourth sensor being positioned opposite from said third sensor with respect to the axis of said rotary portion;
    wherein said fourth sensor is offset from said third sensor so that a phase of output voltage of said fourth sensor advances or delays with respect to a phase of output voltage of said third sensor by $\lambda/2m$ to compensate for an m-order harmonic distortion, wherein a pitch of the harmonic distortion is $\lambda/m$.

3. The incremental rotary encoder according to claim 2, wherein said rotary portion comprises a magnetic drum, which is rotatably supported by a stationary portion of an optical instrument in which said incremental rotary encoder is incorporated, an outer peripheral surface of said magnetic drum comprising a multi-pole magnetized layer having a plurality of equally divided magnetized divisions;

wherein each of said first, second, third and fourth sensors comprises a magnetic sensor, which is fixed to said stationary portion and configured to face said multi-pole magnetized layer, each magnetic sensor comprising a plurality of magnetoresistor elements which are located at one of $\lambda/4$ and $\lambda(3/4)$ intervals on said each sensor, "$\lambda$" representing a pitch of said plurality of magnetized divisions;

wherein an error due to the eccentricity of said magnetic drum and error due to said n-order harmonic distortion are simultaneously compensated for by averaging detected outputs of said first and second magnetic sensors;

wherein said error due to the eccentricity of said magnetic drum and error due to said m-order harmonic distortion are simultaneously compensated for by averaging detected outputs of said third and fourth magnetic sensors; and wherein said error due to the eccentricity of said magnetic drum, said n-order harmonic distortion and said m-order harmonic distortion are simultaneously compensated for by averaging the detected outputs of said first, second, third and fourth magnetic sensors.

4. The incremental rotary encoder according to claim 3, wherein a circumferential length of each equally divided magnetized division on the outer peripheral surface of said magnetic drum is greater than 60 $\mu$m and less and 250 $\mu$m.

5. The incremental rotary encoder according to claim 1, wherein said rotary portion comprises a magnetic drum, which is rotatably supported by a stationary portion of an instrument in which said incremental rotary encoder is incorporated, an outer peripheral surface of said magnetic drum comprising a multi-pole magnetized layer having a plurality of equally divided magnetized divisions;

wherein each of said first and second sensors comprises a magnetic sensor fixed to said stationary portion and configured to face said multi-pole magnetized layer, each magnetic sensor comprising a plurality of magnetoresistor elements, which are located at $\lambda/4$ intervals on said each sensor, "$\lambda$" representing a pitch of said plurality of magnetized divisions; and wherein error due to eccentricity of said magnetic drum and error due to the n-order harmonic distortion are simultaneously compensated for by averaging detected outputs of said first and second magnetic sensors.

6. The incremental rotary encoder according to claim 5, wherein said second magnetic sensor is provided in said incremental rotary encoder so that the phase difference of the second magnetic sensor with respect to said first magnetic sensor is adjustable.

7. The incremental rotary encoder according to claim 6, wherein said phase difference is adjusted to minimize a sum of a plurality of harmonic distortions.

8. The incremental rotary encoder according to claim 5, further comprising an adjusting mechanism that enables movement of said second magnetic sensor in a circle about the axis of said rotary portion, along said multi-pole magnetized layer of said magnetic drum, to adjust the phase difference of said second magnetic sensor with respect to said first magnetic sensor.

9. The incremental rotary encoder according to claim 5, wherein a circumferential length of each equally divided magnetized division on the outer peripheral surface of said magnetic drum is greater than 60 $\mu$m and less and 250 $\mu$m.

10. The incremental rotary encoder according to claim 1, wherein said second sensor is provided in said incremental rotary encoder so that the phase difference of said second sensor with respect to said first sensor is adjustable.

11. A surveying instrument comprising:
a leveling board;
a pedestal coupled to said leveling board and rotatable about a vertical axis relative to said leveling board;
a collimating telescope coupled to said pedestal and rotatable about a horizontal axis relative to said pedestal;
a horizontal-angle measuring device that measures an angle of rotation of said pedestal relative to said leveling board;
a vertical-angle measuring device that measures an angle of rotation of said collimating telescope relative to said pedestal;
wherein at least one of said horizontal-angle measuring device and said vertical-angle measuring device comprises an incremental rotary encoder comprising a rotary portion, a first sensor and a second sensor, the second sensor being positioned substantially opposite from the first sensor with respect to an axis of said rotary portion, the second sensor being offset from the first sensor so that a phase of output voltage of the second sensor advances or delays with respect to a phase of output voltage of the first sensor by $\lambda/2n$ to compensate for an n-order harmonic distortion, wherein a pitch of said harmonic distortion is $\lambda/n$, and n represent any order harmonic distortion.

12. The surveying instrument according to claim 11, comprising a third sensor and a fourth sensor, independent of said first and second sensors, said third sensor being positioned opposite from said fourth sensor with respect to an axis of said rotary portion;

wherein said fourth sensor is offset from said third sensor so that a phase of output voltage of said fourth sensor advances or delays with respect to a phase of output voltage of said third sensor by $\lambda/2m$ to compensate for an m-order harmonic distortion, wherein a pitch of the harmonic distortion is $\lambda/m$.

13. The surveying instrument according to claim 12, wherein said rotary portion comprises a magnetic drum, which is rotatably supported by a stationary portion of an optical instrument in which said incremental rotary encoder is incorporated, an outer peripheral surface of said magnetic drum comprising a multi-pole magnetized layer having a plurality of equally divided magnetized divisions;

wherein each of said first, second, third and fourth sensors comprises a magnetic sensor, which is fixed to said stationary portion and configured to face said multi-pole magnetized layer, each magnetic sensor comprising a plurality of magnetoresistor elements which are located at one of $\lambda/4$ and $\lambda(3/4)$ intervals on said each sensor, "$\lambda$" representing a pitch of said plurality of magnetized divisions;

wherein an error due to the eccentricity of said magnetic drum and error due to said n-order harmonic distortion are simultaneously compensated for by averaging detected outputs of said first and second magnetic sensors;

wherein said error due to the eccentricity of said magnetic drum and error due to said m-order harmonic distortion are simultaneously compensated for by averaging detected outputs of said third and fourth magnetic sensors; and wherein said error due to the eccentricity of said magnetic drum, said n-order harmonic distortion and said m-order harmonic distortion are simultaneously compensated for by averaging the detected outputs of said first, second, third and fourth magnetic sensors.

14. The surveying instrument according to claim 13, wherein a circumferential length of each equally divided magnetized division on the outer peripheral surface of said magnetic drum is greater than 60 μm and less and 250 μm.

15. The surveying instrument according to claim 11, wherein said second sensor is provided in said incremental rotary encoder so that the phase difference of said second sensor with respect to said first sensor is adjustable.

16. The surveying instrument according to claim 11, wherein said rotary portion comprises a magnetic drum, which is rotatably supported by a stationary portion of an optical instrument in which said incremental rotary encoder is incorporated, an outer peripheral surface of said magnetic drum comprising a multi-pole magnetized layer having a plurality of equally divided magnetized divisions;

wherein each of said first and second sensors comprises a magnetic sensor fixed to said stationary portion and configured to face said multi-pole magnetized layer, each magnetic sensor comprising a plurality of magnetoresistor elements, which are located at λ/4 intervals on said each sensor, "λ" representing a pitch of said plurality of magnetized divisions; and wherein error due to eccentricity of said magnetic drum and error due to the n-order harmonic distortion are simultaneously compensated for by averaging detected outputs of said first and second magnetic sensors.

17. The incremental rotary encoder according to claim 16, wherein said second magnetic sensor is provided in said incremental rotary encoder so that the phase difference of the second magnetic sensor with respect to said first magnetic sensor is adjustable.

18. The surveying instrument according to claim 17, wherein said phase difference is adjusted to minimize a sum of a plurality of harmonic distortions.

19. The surveying instrument according to claim 16, further comprising an adjusting mechanism that enables movement of said second magnetic sensor in a circle about the axis of said rotary portion, along said multi-pole magnetized layer of said magnetic drum, to adjust the phase difference of said second magnetic sensor with respect to said first magnetic sensor.

20. The surveying instrument according to claim 16, wherein a circumferential length of each equally divided magnetized division on the outer peripheral surface of said magnetic drum is greater than 60 μm and less and 250 μm.

21. The surveying instrument according to claim 11, wherein said rotary portion comprises a magnetic drum, having a multi-pole magnetized layer, that is supported to be rotatable about one of the vertical and the horizontal axes, each of said magnetic sensors being fixed to one of said leveling board and said pedestal to face said multi-pole magnetized layer.

22. The surveying instrument according to claim 1, further comprising:

a vertical shaft fixed to said leveling board;

at least one support formed on said pedestal; and a horizontal shaft supported by said at least one support;

wherein said pedestal is supported by and rotatable about said vertical shaft;

wherein said magnetic drum rotates together with said at least one support; and wherein said collimating telescope is supported by said at least one support via said horizontal shaft.

23. The surveying instrument according to claim 1, further comprising:

at least one support formed on said pedestal; and a horizontal shaft fixed to said at least one support;

wherein said magnetic drum is supported by said horizontal shaft to be rotatable about said horizontal shaft;

wherein said collimating telescope is supported by and rotatable about said horizontal shaft;

wherein said magnetic drum is rotatable together with said collimating telescope; and wherein each of said magnetic sensors is fixed to said at least one support to face said multi-pole magnetized layer.

24. An incremental rotary encoder comprising:

a rotary portion;

a first sensor; and a second sensor that is positioned opposite from said first sensor with respect to an axis of said rotary portion;

wherein said second sensor is offset from said first sensor so that a phase of output voltage of said second sensor differs from a phase of output voltage of said first sensor by πX, wherein "X" represents any real number greater or equal to one.

25. The incremental rotary encoder according to claim 24, wherein said second sensor is configured such that the phase difference between said second sensor and said first sensor is adjustable.

26. A surveying instrument comprising:

a leveling board;

a pedestal coupled to said leveling board and rotatable about a vertical axis relative to said leveling board;

a collimating telescope coupled to said pedestal and rotatable about a horizontal axis relative to said pedestal;

a horizontal-angle measuring device that measures an angle of rotation of said pedestal relative to said leveling board;

a vertical-angle measuring device that measures an angle of rotation of said collimating telescope relative to said pedestal;

wherein at least one of said horizontal-angle measuring device and said vertical-angle measuring device comprises a magnetic incremental rotary encoder, comprising a rotary portion, a first magnetic sensor, and a second magnetic sensor that is positioned opposite from said first magnetic sensor with respect to an axis of said rotary portion; and wherein said second magnetic sensor is offset from said first magnetic sensor so that a phase of output voltage of said second sensor differs from a phase of output voltage of said first magnetic sensor by π/X wherein "X" represents any real number greater than or equal to one.

27. The incremental rotary encoder according to claim 29, wherein said second magnetic sensor is configured such that the phase difference between said second magnetic sensor and said first magnetic sensor is adjustable.

* * * * *